US010061005B2

(12) United States Patent
Li et al.

(10) Patent No.: US 10,061,005 B2
(45) Date of Patent: Aug. 28, 2018

(54) APPARATUS AND METHOD FOR MULTI-BAND MR IMAGING

(71) Applicants:Siemens Healthcare GmbH, Erlangen (DE); Regents of the University of Minnesota, Minneapolis, MN (US)

(72) Inventors: Xiufeng Li, Shoreview, MN (US); Steen Moeller, St. Louis Park, MN (US); Gregory J. Metzger, Lake Elmo, MN (US); Kamil Ugurbil, Minneapolis, MN (US); Dingxin Wang, Apple Valley, MN (US); Vibhas S. Deshpande, Austin, TX (US)

(73) Assignees: Siemens Healthcare GmbH, Erlangen (DE); Regents of the University of Minnesota, Minneapolis, MN (US)

( * ) Notice: Subject to any disclaimer, the term of this patent is extended or adjusted under 35 U.S.C. 154(b) by 633 days.

(21) Appl. No.: 14/696,783

(22) Filed: Apr. 27, 2015

(65) Prior Publication Data

US 2015/0309142 A1 Oct. 29, 2015

Related U.S. Application Data

(60) Provisional application No. 61/984,145, filed on Apr. 25, 2014.

(51) Int. Cl.
*G01V 3/00* (2006.01)
*G01R 33/561* (2006.01)
*G01R 33/483* (2006.01)
*G01R 33/563* (2006.01)

(52) U.S. Cl.
CPC ...... *G01R 33/5611* (2013.01); *G01R 33/4835* (2013.01); *G01R 33/56366* (2013.01)

(58) Field of Classification Search
CPC ............ G01R 33/5611; G01R 33/4835; G01R 33/56366
USPC ........................................ 324/307, 309, 318
See application file for complete search history.

(56) References Cited

U.S. PATENT DOCUMENTS

2012/0194193 A1\* 8/2012 Rehwald ............ G01R 33/4828
324/318

OTHER PUBLICATIONS

Larkman, D.J., et al., Use of multicoil arrays for separation of signal from multiple slices simultaneously excited. J Magn Reson Imaging, 2001. 13(2): p. 313-7.

(Continued)

*Primary Examiner* — Farhana Hoque (57) ABSTRACT

A magnetic resonance method and system are provided for providing improved multi-band (MB) magnetic resonance imaging. The adaptive MB imaging can be achieved by providing one or more modified multi-band excitation pulse sequences that include at least either one nullified "dummy" slice within a slab that is not excited simultaneously with the other slices during a single multislice acquisition sequence, or one excitation slice group that utilizes a non-uniform slice spacing between simultaneously excited slices. Adaptive GRAPPA or slice-GRAPPA kernel sizes can also be used during image reconstruction to improve speed without excessive point spread blurring or MB reconstruction failure. A total leakage factor (TLF) can also be determined based on test images using modified MB excitation sequences, and used to improve the adaptive MB procedure.

19 Claims, 5 Drawing Sheets

(56) References Cited

OTHER PUBLICATIONS

Breuer, F.A., et al. Controlled aliasing in parallel imaging results in higher acceleration (CAIPIRINHA) for multi-slice imaging. Magn Reson Med, 2005. 53(3): p. 684-91.
Yutzy, S.R., et al., Improvements in multislice parallel imaging using radial CAIPIRINHA. Magn Reson Med, 2011. 65 (6): p. 1630-7.
Moeller, S., et al., Multiband multislice GE-EPI at 7 tesla, with 16-fold acceleration using partial parallel imaging with application to high spatial and temporal whole-brain fMRI. Magn Reson Med, 2010. 63(5): p. 1144-53.
Zahneisen, B., et al., Blipped-CAIPI Spiral for Simultaneous Multi-Slice BOLD fMRI. In: Proceedings of the 20th Annual Meeting of ISMRM, Salt Lake City, Utah, USA, 2013: Abstract 409., 2013(0519).
Nunes, R., et al., Simultaneous Slice Excitation and Reconstruction for Single Shot EPI. In: Proceedings of the 20th Annual Meeting of ISMRM,, Seattle, Washington, USA, 2006: Abstract 293, 2006(0519).
Stab, D., et al., CAIPIRINHA accelerated SSFP imaging. Magn Reson Med, 2011. 65(1): p. 157-64.
Wang, D., et al., High Resolution T2-Weighted Imaging with Whole Brain Coverage at 7 Tesla Using Multiband Slice Accelerated Spin Echo. Proc. Intl. Soc. Mag. Reson. Med. 21 (2013).
Smith, S.M., et al., Temporally-independent functional modes of spontaneous brain activity. Proc Natl Acad Sci U S A, 2012. 109(8): p. 3131-6.
Setsompop, K., et al., Improving diffusion MRI using simultaneous multi-slice echo planar imaging. Neuroimage, 2012. 63(1): p. 569-80.
Kim, T., et al., Whole brain perfusion measurements using arterial spin labeling with multiband acquisition. Magn Reson Med, 2013. 70(6): p. 1653-61.
Feinberg, D.A., A. Beckett, and L. Chen, Arterial spin labeling with simultaneous multi-slice echo planar imaging. Magn Reson Med, 2013. 70(6): p. 1500-6.
Kim, S.G. and N.V. Tsekos, Perfusion imaging by a flow-sensitive alternating inversion recovery (FAIR) technique: application to functional brain imaging. Magn Reson Med, 1997. 37(3): p. 425-35.
Robson, P.M., et al., Comprehensive quantification of signal-to-noise ratio and g-factor for image-based and k-space-based parallel imaging reconstructions. Magn Reson Med, 2008. 60(4): p. 895-907.
Cauley, S.F., et al., Interslice leakage artifact reduction technique for simultaneous multislice acquisitions. Magn Reson Med, 2013.
Moeller, S., et al., Signal Leakage(L-Factor) as a Measure for Parallel Imaging Performance Among Simultaneously Multi-Slice (SMS) Excited and Acquired Signals. In: Proceedings of the 20th Annual Meeting of ISMRM, Melbourne, Australia 2012:Abstract 0519., 2012(0519).
Xu, J., et al., Evaluation of slice accelerations using multiband echo planar imaging at 3 T. Neuroimage, 2013. 83: p. 991-1001.
Li, Xiufeng, et al., Feasibility of Applying MB EPI PCASL for High-Resolution Whole Brain Perfusion Imaging at 7T. Proc. Intl. Soc. Mag. Reson. Med. 22 (2014):0995.
Li, Xiufeng, et al., Theoretical and Experimental Benefits of Multi-Band (MB) EPI for PCASL Brain Imaging. Proc. Intl. Soc. Mag. Reson. Med. 22 (2014):4557.

* cited by examiner

APPARATUS AND METHOD FOR MULTI-BAND MR IMAGING

CROSS-REFERENCE TO RELATED APPLICATION(S)

The present application relates to and claims priority from U.S. Provisional Patent Application Ser. No. 61/984,145 filed Apr. 25, 2014, the disclosure of which is incorporated herein by reference in its entirety.

STATEMENT REGARDING FEDERALLY SPONSORED RESEARCH

This invention was made with government support under P41EB015894 and UL1TR000114 awarded by the National Institutes of Health. The government has certain rights in the invention.

FIELD OF THE DISCLOSURE

The present disclosure relates to a method and a system for providing adaptive acquisition and processing of multi-band magnetic resonance images, and for an improved determination of leakage effects between slices during multiband imaging that can be used to optimize such image acquisition.

BACKGROUND INFORMATION

Magnetic resonance (MR) imaging is a known technology that can produce images of the inside of an examination subject without radiation exposure. In a typical MR imaging procedure, the subject is positioned in a strong, static, homogeneous base magnetic field B0 (having a field strength that is typically between about 0.5 Tesla and 3 Tesla) in an MR apparatus, so that the subject's nuclear spins become oriented along the base magnetic field. Radiofrequency (RF) excitation pulses are directed into the examination subject to excite nuclear magnetic resonances, and subsequent relaxation of the excited nuclear magnetic resonances can generate RF signals. Rapidly switched magnetic gradient fields can be superimposed on the base magnetic field, in various orientations, to provide spatial coding of the RF signal data. The RF signal data can be detected and used to reconstruct images of the examination subject. For example, the acquired RF signal data are typically digitized and stored as complex numerical values in a k-space matrix. An associated MR image can be reconstructed from the k-space matrix populated with such values using a multi-dimensional Fourier transformation.

Multi-band (MB) magnetic resonance imaging is a relatively recent technique that can accelerate imaging acquisition and therefore improve imaging efficiency. In MB imaging, multiple spatially distributed imaging slices are excited and then acquired simultaneously by using multi-banded radiofrequency (RF) pulses, and the acquired superimposed signals from multiple slices can be 'unwrapped' via anti-aliasing reconstruction. An MB factor 'N' can be defined as the number of separate slices simultaneously excited, from which image data is obtained.

In a typical MB imaging procedure, a plurality of N adjacent "bands," or thick slabs, that include the volume to be imaged are defined. This number of slabs is equal to the MB factor. For each excitation/acquisition sequence, one slice within each band is excited substantially simultaneously using an RF pulse sequence, and RF image data is then detected from the excited slices and processed/unwrapped to generate a separate image of each slice. Subsequent MB excitation/acquisition sequences can then be performed, in which further slices are excited, one slice within each band, and further RF image data is detected. This procedure can be continued until all n slices within each of the N slabs have been imaged. Because the k-space lines can be fully sampled during an MB imaging procedure, the simultaneously acquired slices do not exhibit typical $\sqrt{N}$ reductions in signal-to-noise ratio (SNR) that are typically observed with conventional parallel imaging acceleration techniques.

The simultaneous acquisition of multiple slices in a multi-band imaging procedure can greatly reduce total imaging acquisition time for imaging procedures such as, e.g., whole brain applications with EPI. For example, when imaging a volume of N slabs (where N is the MB factor), with each containing n slices, a single-slice imaging procedure would require n*N separate slice excitation/acquisition sequences. In contrast, by using multi-band imaging, a series of only n sequences are required to image the same overall volume, resulting in a reduction factor for the total imaging time of about 1/N. For example, a MB factor of 6 (corresponding to 6 slices excited simultaneously in each sequence) would need only about ⅙ the time required to image the same number of slices one at a time using a conventional single-band (SB) procedure.

MB magnetic resonance imaging can improve imaging results in certain imaging procedures such as, e.g., whole brain ASL perfusion studies, where high in-plane and through-plane resolution is desired and a large number of thin imaging slices may be needed to achieve the desired coverage. Total imaging time is particularly important in ASL studies, as longer times would allow additional tagged/labeled blood to flow into a volume being imaged, and also allow the excitation of such tagged blood to decay further, both factors reducing the efficacy of the resulting perfusion images. MB imaging can facilitate both higher resolutions and shorter acquisition times to generate more accurate perfusion images.

MB imaging was first implemented for a gradient recalled (GRE) imaging method as described, e.g., in D. J. Larkman et al., *Use of multicoil arrays for separation of signal from multiple slices simultaneously excite*, J Magn Reson Imaging, 2001, 13(2): p. 313-7. MB imaging was later applied with the Controlled Aliasing in Parallel Imaging Results in Higher Acceleration (CAPIRIHANA) strategy to control aliasing for other imaging methods as described, e.g., in F. A. Breuer et al., *Controlled aliasing in parallel imaging results in higher acceleration (CAIPIRINHA) for multi-slice imaging*, Magn Reson Med, 2005, 53(3): p. 684-91. Such other imaging methods include, e.g., echo planar imaging (EPI) and steady-state free procession and spin echo imaging. For example, multi-band EPI (MB-EPI) has been demonstrated successfully in functional magnetic resonance imaging (fMRI) and diffusion-weighted imaging (DWI) acquisitions as described, e.g., in K. Setsompop et al., *Improving diffusion MRI using simultaneous multi-slice echo planar imaging*, Neuroimage, 2012, 63(1): p. 569-80. Recently, MB-EPI has also been compared to single-shot 3D GRASE for brain perfusion imaging using a pulsed arterial spin labeling (PASL) method, namely flow-sensitive alternating inversion recovery (FAIR) in D. A. Feinberg et al., *Arterial spin labeling with simultaneous multi-slice echo planar imaging*, Magn Reson Med, 2013, 70(6): p. 1500-6.

However, MB imaging can introduce additional signal artifacts, which can affect image quality and may impair the benefits of MB in quantitative imaging applications, such as arterial spin labeling (ASL). These additional artifacts include, e.g., amplified thermal noise arising from coil-sensitivity-based SENSE, GRAPPA, or slice-GRAPPA imaging reconstruction, as reflected by the geometry factor (g-factor). Leakage contamination for measured imaging signals resulted from imperfect anti-aliasing reconstruction algorithms is another type of MB-related artifact. Increased magnetization transfer (MT) effects can also be introduced by MB imaging, arising from a simultaneous application of multiple off-resonance RF pulses during imaging acquisition Such MT effects can be indicated by observed contrast changes between single-band (SB) and MB images. Both the g-factor and leakage contamination levels tend to increase with MB factor, and can be dependent on the applied MB acceleration factors as well as on other MB-specific parameters, such as the GRAPPA or slice-GRAPPA kernel size and field of view (FOV) shift factor.

MB imaging also may limit protocol flexibility/operability in practice. For example, in clinical practice or neuroscience research, imaging protocols typically have a fixed coverage large enough to accommodate the majority of subjects. The strategy of prescribing imaging slices is also usually predetermined, e.g., imaging slices that are angled and/or centered to the AC (anterior commissure)-PC (Posterior commissure) line for neuroimaging. For traditional imaging methods, the number of imaging slices can be freely adjusted according to the size of a particular subject's specific organs. However, due to the intrinsic characteristics of MB imaging, the number of imaging slices is required to be an integer multiple of the MB factor. This can lead to difficulties in changing the number of imaging slices across subjects, especially in cases where high MB acceleration factors (e.g. MB factor 8) are used, where an intermediate number of imaging slices may be needed for sufficient coverage without changing the MB acceleration factor in the protocol.

To evaluate the contamination due to signal leakage resulting from imperfect slice un-aliasing during MB reconstruction, the leakage factor (LF) was proposed as a metric to evaluate the residual aliasing from one slice into other simultaneously acquired slices. To determine the LF, different methods have been proposed and demonstrated, e.g., based on a single representative acquired volume with single band imaging for a given coil and anatomy followed by simulation either using a Frequency Modulation/Monte Carlo (FMMC) method or a Linear System Leakage Approach (LSLA). However, the LF does not directly reflect the total leakage contamination from all other simultaneously acquired imaging slices on a single slice, which is arguably a more meaningful metric when trying to assess the impact of signal contamination relative to a desired signal.

Additionally, in contrast to traditional imaging methods, acquiring unnecessary inferior or superior slices with MB techniques can produce artifacts in simultaneously acquired slices because of imperfect slice anti-aliasing, resulting in additional signal leakage (i.e., image contamination) compared to a procedure in which such unnecessary slices are excluded. Furthermore, unnecessary imaging slices can also interfere with functional imaging acquisitions. For example, in ASL imaging, additional inferior imaging slices can overlap geometrically with the labeling plane, and when minimal TR is used for imaging, the saturation effects of these overlapped imaging slice acquisition can adversely affect spin preparation that is a feature of this quantitative technique.

In conventional MB imaging, a single set of fixed parameters/configurations is used for both imaging acquisition and reconstruction, and these parameters/configurations include RF pulses and gradient waveform settings, imaging readout options, MB factor, Generalized Auto-calibrating Partially Parallel Acquisition (GRAPPA) kernel size, and slice FOV shift factor that can be used in a conventional CAPIRI-HANA technique. The use of fixed parameters/configurations for MB acquisition and reconstruction limits the ability to achieve optimal performance in terms of reducing g-factor, decreasing leakage contamination and decreasing acquisition flexibility. For example, to avoid MB-EPI reconstruction failures in specific brain regions, a single large slice-GRAPPA kernel size of 5 or 7 must be used for all MB imaging slices, instead of only using this kernel for those slices that failed reconstruction. Thus, the increase of point-spread function resulting from a large kernel is shared by all slices, thereby increasing image blurring and reducing reconstruction speeds.

Accordingly, it would be desirable to have a system and method for multi-band (MB) magnetic resonance imaging that addresses some of the shortcomings described above, and that may further optimize MB protocols and provide improved image quality, e.g., in brain, spine, musculoskeletal, body, and cardiac imaging applications.

SUMMARY OF EXEMPLARY EMBODIMENTS

Exemplary embodiments of the present disclosure can provide a magnetic resonance system for improved multi-band (MB) magnetic resonance (MR) imaging that uses adaptive techniques to generate RF image data and/or to reconstruct MR images therefrom.

The MR system includes a pulse generation unit, pulse sequence control unit, a radio-frequency amplifier, and one or more RF antennas, such as a body coil, that are further configured to generate and emit RF excitation pulses to excite nuclear spins. The MR system further includes magnetic gradient coils, which may be oriented along the three primary axes (x-y- and z-directions). Other or additional orientations of the magnetic gradient coils can be used in further embodiments. A gradient coil control unit can be provided to supply pulsed current to the magnetic gradient coils to generate transient gradient magnetic fields superimposed on the static base magnetic field B0. The gradient coil control unit can also communicate with the pulse sequence control unit, such that RF pulses and magnetic field gradients can be synchronized in various ways to provide spatially selective excitation and spatial encoding of RF signals.

One or more local coils can also be provided to detect RF signals emitted by the excited nuclear spins, which may also be detected by the RF antenna. A radio-frequency preamplifier and an acquisition unit can also be provided to amplify, process, and digitized the detected RF signals. In certain embodiments, a coil (e.g., a body coil) can be configured to both emit RF excitation pulses and receive RF signals emitted by nuclear spins, and an upstream transmission-reception diplexer can be provided to regulate the relaying of RF energy to/from the coil.

The MR system can further include an image processing unit configured to generate one or more images based on the RF signals that represent image data. Such images can be presented to a user via an operator console and/or be stored in a memory unit. A processor arrangement can be provided and configured to control various components of the MR system, e.g., based on programmed instructions. For example, the processor arrangement can be configured to control the pulse generation unit, pulse sequence control unit, the radio-frequency amplifier, and/or the gradient coil control unit to generate particular temporal sequences of RF pulses and magnetic field variations, and optionally to control other components such as the image processing unit, according to exemplary embodiments of the disclosure described herein.

Embodiments of the present disclosure can provide an adaptive multi-band imaging (AMI) system and technique that includes adaptive RF pulses, adaptive image acquisition parameters, and/or use of adaptive reconstruction parameters. Adaptive parameters can include one or more parameters, variables, settings, or the like that vary within portions of the same image data acquisition procedure and/or image reconstruction procedure.

In exemplary embodiments of the disclosure, an adaptive MB RF pulse sequence can be provided, in which one or more RF pulse components that would excite unnecessary or undesired imaging slices during a single multi-band acquisition sequence can be turned off or nullified in an adaptive MB RF pulse. These unexcited (or "dummy") slices can be at the outermost slice bands. In further embodiments, these unexcited slices can be in a middle portion of a simultaneously-excited slice group (e.g., within one or more central slice bands), e.g., to avoid unnecessary excitement and imaging of a volume that is between two regions of interest to be imaged such as, e.g., a pair of kidneys.

In an exemplary embodiment of the disclosure, adaptive MB RF pulses can be created in real time based on the prescriptions of a particular imaging protocol. For example, one or more MB RF pulse sequences in a series of such MB pulse sequences can be generated with a modified or non-constant number of RF pulse components, based on acquisition and/or reconstruction results obtained from preceding imaging sequences that may be part of the same imaging procedure (e.g. a MB imaging procedure that images an entire brain). In certain embodiments, the adaptive MB RF pulse sequences can be specified by selecting or modifying relevant parameters that are presented through a user interface, such as a menu or a graphical image.

In further embodiments, an adaptive MB imaging system and procedure can be provided that includes simultaneous excitation of a plurality of slices, wherein a distance between adjacent excited slices is not constant. Alternatively, the MB imaging procedure can include a series of simultaneous slice excitation sequences, where the distance between neighboring slices that are excited simultaneously differs in at least two sequences of the series.

In a further embodiment, unique MB RF pulses and RF-based or gradient blip-based CAPIRIHANA (a.k.a. CAIPI) parameters can be adaptively configured for different groups of imaging slices. The CAPIRIHANA (or CAIPI) technique introduces a relative field-of-view (FOV) shift among two or more simultaneously excited/acquired slices by modulating the phase of the signals obtained from different slices. The distance between aliased pixels in such techniques can be effectively increased to improve slice separation with reduced noise amplification penalty and residual aliasing artifacts. In certain embodiments, a MB imaging is provided in which a series of two or more MB imaging sequences are performed in a series of such sequences to image an entire volume, where at least two individual sequences have different MB factors (and thus different slice separation distances).

In a further embodiment of the disclosure, adaptive application of slice FOV shifts can be provided for one or more slice groups, e.g., in a series of MB pulse sequences that may be configured to ignore one or more dummy slices of the slice group. The adaptive FOV shifts can based on (or specific to) particular groups of simultaneously acquired slices, to the MB factor during conventional MB imaging, and/or to the effective MB factor in an adaptive MB acquisition procedure (where the effective MB factor can be smaller than the actual MB factor—or number of slice-group slabs—based on the presence of one or more unexcited dummy slices).

Further embodiments of the present disclosure can also provide adaptive MB image reconstruction, which can accommodate the adaptive acquisition strategies described herein as well as further improve MB imaging quality. For example, simultaneously acquired imaging slices that include a pulse sequence with a particular MB factor and one or more dummy slices can be reconstructed separately with a lower MB factor. A reduced MB factor used for reconstruction can correspond to the actual number of simultaneously-excited slices, e.g., the actual MB factor minus the number of dummy slices.

In a further exemplary embodiment, an adaptive image reconstruction procedure can be provided for an MB acquisition that includes one or more dummy slices, where the reconstruction procedure is carried out based on the actual MB factor, with the data corresponding to the dummy slices explicitly filled with zeroes for reconstruction kernel training.

Further embodiments of the disclosure can provide an adaptive MB image reconstruction system and method in which large kernel sizes (e.g. a size of 5 or 7) are used only for the groups of slices that tend to exhibit reconstruction failure, and smaller GRAPPA kernel sizes (e.g., a kernel size of 3) are used to reconstruct images for other groups of slices.

In a still further embodiment, an adaptive imaging system and procedure can be provided in which separately acquired water and fat information are adaptively combined across space to improve MB kernel training and resulting quality of the reconstructed images. The separate water and fat information can be generated, e.g., by using a conventional 2-point or 3-point DIXON technique, or an IDEAL technique.

In another embodiment of the present disclosure, an improved signal contamination measurement technique can be provided that can be used to calculate a total leakage factor (TLF) that is present in MB imaging. The TLF can quantitatively evaluate how much contamination a single targeted slice experiences from the other simultaneously excited/acquired slices during multi-band imaging procedures. To estimate signal contamination in a particular slice due to multi-band imaging, the RF pulse exciting this particular slice can be turned off (e.g., provided with zero amplitude), and the MB RF image data can be obtained and reconstructed for this slice to reveal the total signal contamination from all other simultaneously excited slices within the particular unexcited ("dummy") slice. The TLF and associated MB leakage image data can be used to evaluate and improve image reconstruction accuracy in general MB imaging, e.g., by guiding the generation of more accurate coil sensitivity profiles, developing an optimized kernel training model, and/or identifying a superior algorithm for compressive-sensing.

Further embodiments of the present disclosure can provide improved MB image quality by accounting for the effects of MB leakage and reducing its effect on reconstructed images using TLF information. For example, a kernel fitting function that minimizes TLF factors and associated MB leakage effects can be determined for a leakage constrained slice-GRAPPA technique. The usage of TLF and MB leakage image data can be used for reconstruction optimization of images acquired with Cartesian sampling. In further embodiments, improved image reconstruction techniques using TLF and MB leakage information can be applied to MB image data acquired with non-Cartesian sampling.

Further embodiments of the disclosure can provide an exemplary method for adaptive multi-band (MB) magnetic resonance imaging that includes at least one adaptive image data acquisition procedure. In one embodiment, at least one MB pulse sequence of a series of pulse sequences for an MB factor of N can be configured to excite fewer than N slices, e.g., by providing a null signal for the portion of the excitation pulse sequence corresponding to one or more "dummy" slices. In a further embodiment, the adaptive acquisition procedure includes providing a series of MB pulse sequences for an MB factor of N in which one or more of the RF pulse sequences excites slices having a spacing that differs from the fixed spacing for N slices. In yet another embodiment, the adaptive acquisition procedure includes providing an adaptive or non-constant FOV shift factor for at least one slice that is different than the FOV factor for at least one other slice during the MB acquisition procedure. In another embodiment, the adaptive acquisition procedure includes providing at least two of these adaptive acquisition features.

Additional embodiments of the disclosure can provide an exemplary method for adaptive multi-band (MB) magnetic resonance imaging that includes at least one adaptive reconstruction procedure used to process the MB image data. In one embodiment, adaptive kernel sizes can be used for image reconstruction, e.g., a reduced or smaller kernel size can be utilized for groups of slices that tend not to exhibit reconstruction failure. In another embodiment, a kernel can be determined or trained based on the presence of one or more "dummy" slices during MB image data acquisition, such that the kernel can be based on the actual number of slices excited in a particular MB pulse sequence, which may be less than the overall MB factor N. In a further embodiment, the reconstruction kernel can be trained based on separately-acquired fat and water information, which can improve image quality by accounting for the effects of incomplete fat signal suppression and reducing the degree of lipid ghosting that can occur during EPI imaging procedures. In a still further embodiment, the adaptive image reconstruction can be performed using a kernel that is optimized to minimize both image artifacts and MB leakage. In yet another embodiment, a reconstruction kernel can be fitted based on both image artifacts and MB leakage data (e.g. a TLF) to reduce the effects of image artifacts and the levels of signal noise in the resulting image.

In still further embodiments, an adaptive MB image reconstruction system and method can be provided that includes a combination of two or more of the adaptive image data acquisition and/or image reconstruction techniques described herein.

In still further embodiments, an adaptive MB imaging system and procedure can be provided in which adaptive MB imaging settings and/or reconstruction configurations can be used with an imaging time series acquisition, in which different sets of MB imaging parameters and/or different MB reconstruction configurations can be applied across different time points.

These and other objects, features and advantages of the present disclosure will become apparent upon reading the following detailed description of embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying figures showing illustrative embodiments, results and/or features of the exemplary embodiments of the present disclosure, in which.

Throughout the drawings, the same reference numerals and characters, unless otherwise stated, are used to denote like features, elements, components, or portions of the illustrated embodiments. Similar features may thus be described by the same reference numerals, which indicate to the skilled reader that exchanges of features between different embodiments can be done unless otherwise explicitly stated. Moreover, while the present disclosure will now be described in detail with reference to the figures, it is done so in connection with the illustrative embodiments and is not limited by the particular embodiments illustrated in the figures. It is intended that changes and modifications can be made to the described embodiments without departing from the true scope and spirit of the present disclosure as defined by the appended claims.

DETAILED DESCRIPTION OF EXEMPLARY EMBODIMENTS

The present disclosure relates to methods and systems for providing improved multi-band MR imaging. Embodiments of the present disclosure can provide a system and method for multi-band MR imaging that can turn off excitation of unnecessary imaging slices in a designed MB RF pulse. These unnecessary slices can be, for example, either at the edge or in the center of a simultaneously-excited slice group.

The disclosed MB imaging system and method can eliminate contamination from the unnecessary imaging slices on other simultaneously acquired slices. Off-resonance RF saturations (MT effects) can be reduced in the imaged tissue, thereby increasing the signal-to-noise ratio and reducing image contrast changes. Further, artifacts arising from interference from the side lobes of the excitation RF pulses can be avoided. Also, embodiments of the present disclosure can reduce imaging specific absorption rate (SAR) in patients. Embodiments of the present disclosure can further provide enhanced flexibility of multi-band imaging, e.g., to allow adjustable slice spacing within a single multislice acquisition sequence.

Figure 1:
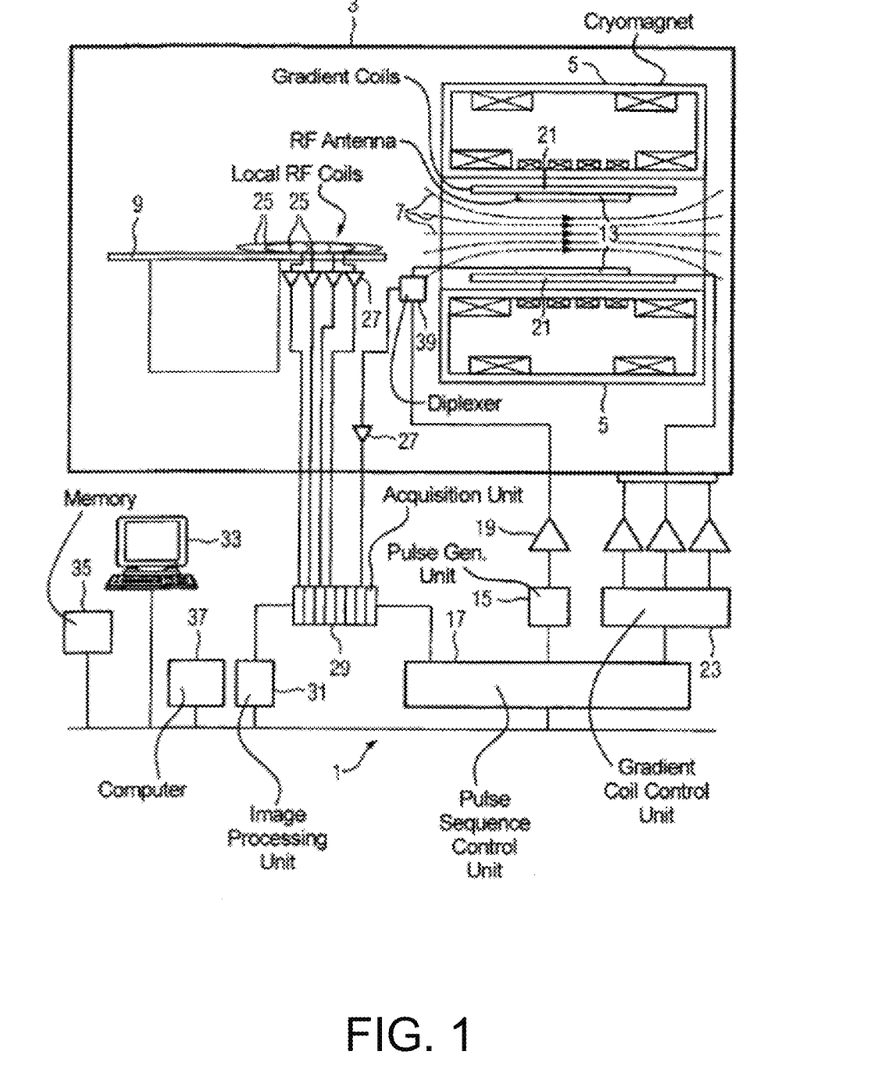
FIG. 1 schematically illustrates the basic components of a magnetic resonance imaging system constructed and operating in accordance with embodiments of the present disclosure.

FIG. 1 schematically shows the design of a magnetic resonance system 1with certain components in accordance with embodiments of the present disclosure. The MR system 1 is configured, inter alia, to provide various magnetic fields tuned to one another as precisely as possible in terms of their temporal and spatial characteristics to facilitate examination of portions of a subject's body using magnetic resonance imaging techniques.

A strong magnet 5 (typically a cryomagnet) having a tunnel-shaped opening is provided in a radio-frequency (RF) shielded measurement chamber 3 to generate a static, strong base magnetic field 7. The strength of the base magnetic field 7 is typically between 1 Tesla and 3 Tesla, although lower or higher field strengths can be provided in certain embodiments. A body or a body part to be examined (not shown) can be positioned within the substantially homogeneous region of the base magnetic field 7, e.g., provided on a patient bed 9.

Excitation of nuclear spins of certain atoms within the body can be provided via magnetic RF excitation pulses that are radiated using an RF antenna 13, such as a body coil. Other configurations of RF coils or antennas can also be provided in further embodiments, and such configurations may be adapted for particular portions of the subject anatomy to be imaged. The RF excitation pulses are generated by a pulse generation unit 15 that is controlled by a pulse sequence control unit 17. After an amplification by a radio-frequency amplifier 19, the RF pulses are relayed to the RF antenna 13. The exemplary RF system shown in FIG. 1 is a schematic illustration, and particular configurations of the various components may vary from that illustrated in exemplary embodiments of the disclosure. For example, the MR system 1 can include a plurality of pulse generation units 15, a plurality of RF amplifiers 19, and/or a plurality of RF antennas 13 that may have different configurations depending on the body parts being imaged.

The magnetic resonance system 1 further includes gradient coils 21 that can provide directionally and temporally varied magnetic gradient fields for selective excitation and spatial encoding of the RF signals that are emitted and/or received by the RF antenna(s) 13. The gradient coils 21 are typically oriented along the three primary axes (x- y- and z-directions), although other or additional orientations may be used in certain embodiments. Pulsed current supplied to the gradient coils 21 can be controlled by a gradient coil control unit 23 that, like the pulse generation unit 15, is connected with the pulse sequence control unit 27. By controlling the pulsed current supplied to the gradient coils 21, transient gradient magnetic fields in the x-, y-, and z-directions can be superimposed on the static base magnetic field B0. This makes it possible to set and vary, for example, the directions and magnitudes of a slice gradient magnetic field Gs, a phase encode gradient magnetic field Ge, and a read (frequency encode) gradient magnetic field Gr, which can be synchronized with emission and detection of RF pulses. Such interactions between RF pulses and transient magnetic fields can provide spatially selective excitation and spatial encoding of RF signals.

RF signals emitted by the excited nuclear spins can be detected by the RF antenna 13 and/or by local coils 25, amplified by associated radio-frequency preamplifiers 27, and processed further and digitized by an acquisition unit 29. In certain embodiments where a coil 13 (such as, for example, a body coil) can be operated both in transmission mode and in acquisition mode (e.g., it can be used to both emit RF excitation pulses and receive RF signals emitted by nuclear spins), the correct relaying of RF energy is regulated by an upstream transmission-reception diplexer 39.

An image processing unit 31 can generate one or more images based on the RF signals that represent image data. Such images can be presented to a user via an operator console 33 and/or be stored in a memory unit 35. A processor arrangement 37 can be configured to control various individual system components. For example, the processor arrangement 37 can be configured by programmed instructions to control such components to generate particular sequences of RF pulses and magnetic field variations according to exemplary embodiments of the disclosure described herein.

Conventional MB techniques use the same set of parameters for each MB sequence that excites a plurality of slices (e.g., that simultaneously excites a slice within each one of N slice groups or slabs, where N is the MB factor). A series of such MB sequences can be used to image the entire volume of interest, e.g., where the series results in excitation of (and image data acquisition from) all n slices within each slab of the N slabs.

In contrast, embodiments of the present disclosure can provide an adaptive multi-band imaging (AMI) system and technique that include application of adaptive RF pulses and image acquisition parameters, and use of adaptive reconstruction parameters. That is, different ones of the MB imaging acquisition sequences within a series of such sequences, and/or different portions of the acquisition procedure and/or image reconstruction procedure, can be provided with different sets of parameters, as described in detail herein.

In exemplary embodiments of the disclosure, one or more RF pulse components that would excite unnecessary or undesired imaging slices during a single multi-band acquisition sequence can be turned off in an adaptive MB RF pulse. These unnecessary slices can be, e.g., at the edge or in the middle of the simultaneously-excited slice group. The selection of which slices may be unnecessary (and thus remain unexcited as "dummy" slices by certain pulse sequences) can be based on the imaging regions of interests. For example, in a renal anatomic imaging procedure with sagittal slices covering both kidneys, the slices covering the volume between the two kidneys may be unnecessary and can be selected to be unexcited "dummy" slices. As a further example, the slices between two hips during sagittal imaging of bilateral hips are typically not of interest, and need not be excited. When imaging any particular organ or region of the body (e.g. a brain, heart, or the like), one or more slices within the slice bands at the ends of the imaged volume may not be of interest, and need not be excited during the MB imaging procedure.

Such adaptive modification of can be provided for one or more MB RF pulse sequences in a series of such pulse sequences configured to image an entire volume. Modifying one or more MB pulse sequences to "turn off" the portions of these pulses that would excite unnecessary/uninteresting slices can provide improved quality of the resulting MB image, e.g., by reducing the amount of signal leakage between simultaneously-acquired slice image data and by allowing a reduced number of overlapped slices to be unwrapped using an anti-aliasing reconstruction.

In an exemplary embodiment of the disclosure, MB RF pulses can be created in real time based on the prescriptions of a particular imaging protocol. For example, in conventional MB imaging, MB RF pulses are typically constructed using a fixed number of RF pulse components for each MB pulse sequence in a series of such pulse sequences, to excite all slices throughout the whole imaging volume. In contrast, embodiments of the adaptive MB imaging procedures as described herein can include one or more MB RF pulse sequences in a series of such MB pulse sequences that are generated with a modified or non-constant number of RF pulse components. Such modified pulse sequences can be provided by excluding one or more pulse components that would excite one or more unnecessary slices in a simultaneous excitation slice group for the MB imaging procedure. For example, the adaptive MB imaging system and method described herein can include a disabling of excitation and acquisition of image data for unnecessary or undesired imaging slices, based on adaptive MB RF pulse sequences. Such adaptive MB RF pulse sequences can be specified or provided, e.g. by selecting or modifying relevant parameters that can be presented through a user interface, such as a menu or a graphical image that can be shown on a display screen or the like.

In further embodiments, an adaptive MB imaging system and procedure can be provided that facilitates selection and excitation of a user-defined distance between simultaneously excited slices for each excitation slice group, using one or more adaptive MB RF pulses that can be tailored to any particular imaging requirements or constraints.

Figure 2:
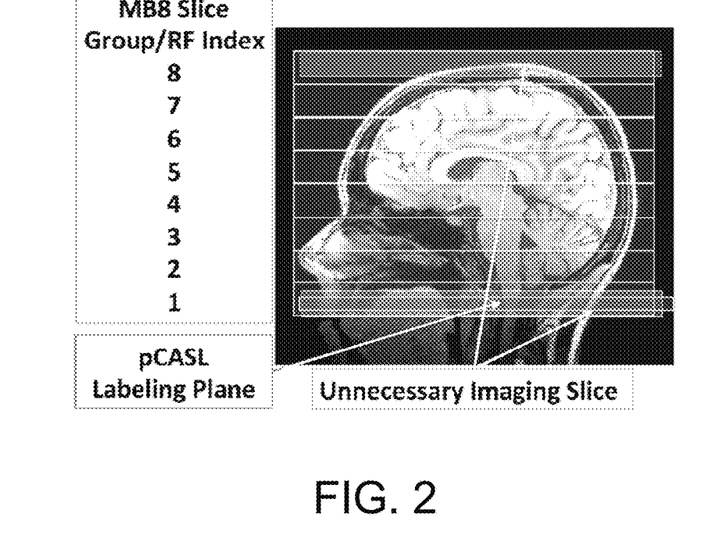
FIG. 2 is an exemplary illustration of a multi-band imaging geometry with MB factor of 8, illustrating two "unnecessary" imaging slices, one of which intersects with a labeling plane for pCASL imaging.

For example, the exemplary side view of a brain image in FIG. 2 illustrates the eight MB slabs or slice groups (MB factor=8, or MB8) for a pseudo-continuous arterial spin labeling (pCASL) MB-EPI perfusion imaging procedure. The unnecessary/undesired imaging slices for whole brain imaging of the presented subject are indicated as the lower and upper portions, respectively, of the lowermost and uppermost slice groups (MB index=1 and 8, respectively) in FIG. 2. In this example, some unnecessary slices within slice group 1 can also overlap with the pCASL labeling plane, as shown in FIG. 2, such that imaging of those slices can generate interference and/or unwanted effects on the pCASL procedure. Accordingly, modifying certain ones of the MB8 pulse sequences to turn off the portions of the pulses that would excite those unnecessary slices within slice groups 1 and 8 can provide improved quality of the resulting MB image, e.g., by avoiding MB excitation within the pCASL labeling plane.

In a further embodiment, unique MB RF pulses and parameters for a conventional Controlled Aliasing in Parallel Imaging Results in Higher Acceleration (CAPIRIHANA) technique (also known as Controlled Aliasing in Parallel Imaging, or CAIPI, technique) can be adaptively configured for different groups of imaging slices. The CAPIRIHANA (or CAIPI) technique introduces a relative field-of-view (FOV) shift among two or more simultaneously excited/acquired slices by modulating the phase of the signals obtained from different slices. Such modulation can be, e.g., RF-based (RF-CAIPI) or gradient blip-based (blipped-CAIPI). This approach can effectively increase the distance between aliased pixels and improves slice separation with reduced noise amplification penalty and residual aliasing artifacts. For example, when 14 imaging slices are required, four groups of three interleaved imaging slices can be internally acquired using an MB factor of 3, and the remaining 2 slices can be acquired in a single group with an MB factor of 2. Alternatively, two groups of imaging slices could be acquired having an MB factor of 4 (8 slices total), and two further groups of imaging slices can be acquired with an MB factor of 3 (6 slices total). The advantage of such an approach is that, by using lower MB factors, the associated g-factor penalty can be reduced, thereby providing an improved signal to noise ratio (SNR).

Slice FOV shift factors across imaging space can affect leakage contamination because they determine the effective distance between aliased pixels of MB images. For a fixed set of MB factor and corresponding slice FOV shift factor, such leakage is dependent on the receiver coils used and image location. Therefore, a FOV shift value that can reduce or minimize leakage contamination typically depends on the actual MB factor used in a particular MB pulse sequence, together with the sensitivity profiles of RF receiver coils used to detect the RF signals from the excited slices. Although an optimal slice FOV shift factor is 2 for an MB factor of 2, the optimal slice FOV shift factor can also be position dependent for larger values of the MB factor. Accordingly, in a further embodiment of the disclosure, adaptive application of slice FOV shifts for each slice group (e.g., for each MB pulse sequence that may be configured to ignore one or more dummy slices of the slice group) can be provided that are selected, e.g., to reduce leakage contamination, e.g., in specific brain regions. Such FOV shifts can be specific to particular groups of simultaneously acquired slices and to the MB factor during conventional MB imaging, as well as to the effective MB factor in an adaptive MB acquisition procedure, which can have a smaller value based on the presence of one or more dummy slices.

Figure 3:
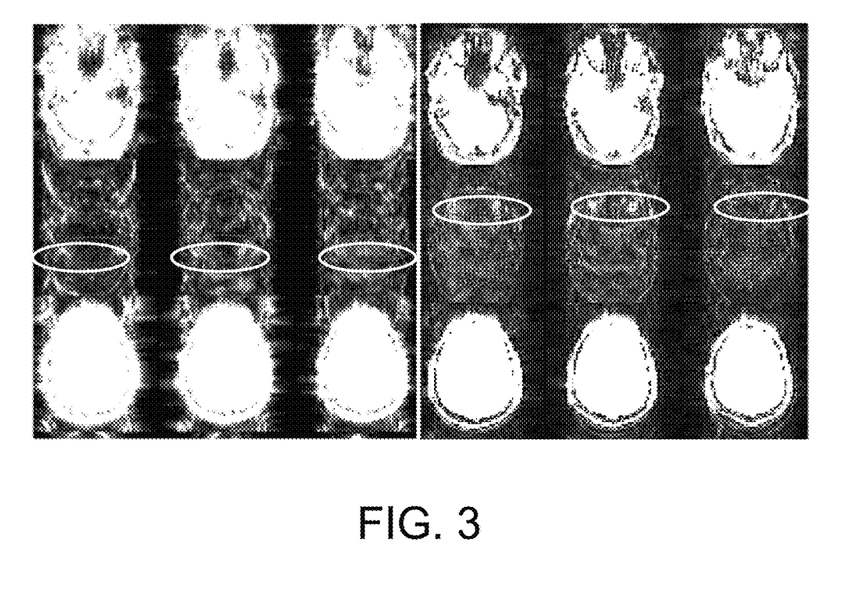
FIG. 3 is an exemplary series of images showing spatially shifting leakage contamination during imaging of eyeballs arising from different phase encoding FOV shift factors.

For example, FIG. 3 illustrates an example of spatially shifting leakage contaminations during imaging of eyeballs (indicated by ellipses in the central region of each image) arising from an application of different phase encoding shift factors. The two sets of leakage contamination images shown in FIG. 3 were acquired with the same imaging parameters, but different phase encoding FOV shift factors. As indicated by these images, a change in the FOV shift factor used can affect the location of leakage contamination artifacts in the targeted images. This observation suggests that varying the FOV shift factor across slice groups can facilitate a reduction or minimization of the leakage contamination for targeted regions of interest. Although demonstrated specifically in imaging of the brain, the effect of FOV shift factor on leakage contamination location will generally be the same in imaging of other organs. Accordingly, adaptive application of FOV shift factors across slices may be a useful technique for improving image quality in MB imaging procedures.

Further embodiments of the present disclosure can also provide adaptive MB image reconstruction, which can accommodate the adaptive acquisition strategies described herein as well as further improve MB imaging quality. For example, simultaneously acquired imaging slices that include a pulse sequence with a particular MB factor and one or more dummy slices can be reconstructed separately with a lower MB factor. A reduced MB factor used for reconstruction can correspond to the actual number of simultaneously-excited slices, e.g., the actual MB factor minus the number of dummy slices.

A "reduced" reconstruction computational demand corresponding to the reduced MB factor can reduce unwanted g-factor effects during image reconstruction, since the g-factor is proportional to the effective MB factor used. Further, unwanted contamination due to thermal noise associated with the dummy slices can be avoided by training the reconstruction kernel with only the excited slices in a particular MB imaging sequence (e.g., the reconstruction kernel can be trained and applied based on the reduced MB factor for a given multislice acquisition). Thus, using a reduced MB factor construction can facilitate improved image reconstruction based only on the simultaneously excited slices, rather than the original MB factor that may include one or more (non-excited) dummy slices.

In a further exemplary embodiment, an image reconstruction can be performed on an MB acquisition that includes one or more dummy slices using the original MB factor, with the data corresponding to the dummy slices explicitly filled with zeroes for reconstruction kernel training. This alternative reconstruction approach can also improve the image reconstruction as compared to using a full kernel based on the original MB factor that does not account for the presence of one or more dummy slices.

Large GRAPPA or slice-GRAPPA kernel sizes (e.g., a kernel size of 5 or 7) are used in conventional MB imaging procedures to avoid MB reconstruction artifacts in specific brain regions. However, using such large GRAPPA kernel sizes can introduce unwanted or undesirable effects such as, e.g., increased point spread function and image blurring (where GRAPPA kernel size is proportional to the degree of image slice blurring) and reduced reconstruction speeds. MB imaging reconstruction failure occurs at specific spatial locations for particular coils and MB factors, such that it is necessary to apply large GRAPPA kernel sizes only for specific groups of simultaneously acquired imaging slices that tend to exhibit MB imaging reconstruction failure.

Accordingly, further embodiments of the disclosure can provide an adaptive MB image reconstruction system and method in which large kernel sizes (e.g. a size of 5 or 7) are used only for the groups of slices that tend to exhibit reconstruction failure, and smaller GRAPPA kernel sizes (e.g., a kernel size of 3) are used to reconstruct images for other groups of slices. Applying such an adaptive GRAPPA kernel size in MB imaging reconstruction can provide a balance between reconstruction speed and the resulting point spread function/blurring, while avoiding MB reconstruction failure and a need for more powerful/expensive computational hardware. Imaging slices that exhibit high local total leakage contamination tend to fail with an apparent loss of signals and tissue contrasts in MB imaging procedures. Accordingly, one of ordinary skill in the art could readily determine a reduced or minimal kernel size for difference slice groups, without extensive experimentation, based on the quality of MB images acquired with different kernel sizes for each MB imaging protocol.

Due to large $B_0$ variations over the anatomy of interest (e.g., from inferior to superior in the brain), the phase of fat can also vary with spatial location. Inhomogeneities in the $B_0$ magnetic field are present in typical MR imaging systems and methods. Such inhomogeneities can be larger at an interface between tissue and air, for example, in the inferior brain regions, frontal lobes and superior slices containing a portion of the skull. Single-band imaging signals used for conventional MB reconstruction kernel training include both water and incompletely suppressed fat signals. Reconstruction kernels are typically trained under the assumption that single-band reference images contain only water signals (e.g., signals at a single frequency). Thus, these $B_0$ inhomogeneities cause a shift in local resonance frequency for both water and fat signals, thereby reducing the effectiveness and/or accuracy of MB imaging reconstruction kernel training using simple water images and acquired navigator phases. Physical deviations from this assumption can result in incorrect MB reconstructions, and exacerbate the known problem of lipid ghosting that commonly occurs in EPI imaging techniques. For example, the local shifts in resonance frequency arising from B0 inhomogeneity can cause leakage contaminations arising from the fat signals to manifest as ghosts and inaccurate phases for navigator acquisition.

Accordingly, in a still further embodiment, separately acquired water and fat information can be adaptively combined across space to further improve MB kernel training and resulting quality of the reconstructed images. Acquiring separate fat and water images and navigator phases using a fat-water imaging technique and an optimized $B_0$ for specific slices in a MB slice group can reduce these adverse effects on MB imaging reconstruction kernel training to further improve the quality of MB images. The separate water and fat information can be generated, e.g., by using a conventional 2-point or 3-point DIXON technique, or an IDEAL technique. This improved procedure for kernel training using separate water and fat image data is compatible with, and can be applied in combination with, one or more of the various adaptive MB imaging and reconstruction embodiments described herein.

To better understand the impact of MB data acquisition on imaging techniques such as ASL perfusion imaging quantification, components of the complex MB excitation RF pulse can be manipulated. Such manipulation can facilitate assessment of effects such as those arising from leakage contamination due to imperfect anti-aliasing reconstruction. For example, experimental measurement of the conventional leakage factor (LF) can be obtained by exciting only a single slice during a MB acquisition procedure, and measuring the contamination within the other (MB-factor)-1 slices, which are not excited and behave as "dummy" slices. Such an RF manipulation is denoted as MB imaging with MB-RF$_{in}$.

In contrast, embodiments of the present disclosure provide an alternative signal contamination measurement that can be used to calculate the total leakage factor (TLF) described herein below. The TLF can quantitatively evaluate how much contamination a single targeted slice experiences from the other simultaneously excited/acquired slices during multi-band imaging procedures. To estimate signal contamination due to multi-band imaging in a targeted slice, the RF pulse exciting this particular slice can be turned off (e.g., provided with zero amplitude). The multi-band RF excitation pulse with a particular slice excitation turned off can be denoted as MB imaging with MB-RF$_{out}$. For consistency, a full MB acquisition with RF pulses enabled for all MB-factor slices (in contrast to both MB-RF$_{out}$ and MB-RF$_{in}$) can be referred to as MB-RF$_{all}$.

With an MB-RF$_{out}$ pulse manipulation, MB reconstruction of the aliased slices can reveal the total signal contamination from all other simultaneously excited slices within the particular unexcited ("dummy") slice. The method of acquiring data based on one or more dummy slice(s) in a MB acquisition to experimentally determine signal contamination will be referred to as Leakage Evaluation via Acquired Dummy Slice(s) (LEADS).

Even though the TLF can be estimated using known methods, such estimates would differ from the TLF as determined by the acquisition strategy described herein. For example, calculating TLF from a single non-MB acquisition requires summing together individual LF estimates, which is complicated by the complex nature of the signals as well as the absence of MB RF pulses. The additional leakage effects generated by using MB RF pulses can be properly realized through the LEADS method. Furthermore, subject bulk motion can induce the leakage contamination signal changes, and by using the LEADS method described herein, leakage contamination signals over time can be directly imaged in vivo, thereby reflecting the bulk motion effects on leakage contamination.

In MB imaging, the signals generated for a particular MB imaging slice primarily originate from the slice itself. However, contamination signals can arise from signal leakage due to imperfect anti-aliasing of the other simultaneously acquired slices and superimposed amplified thermal noise. To characterize the relative impact of this contamination on the signal of interest, the total leakage factor (TLF) can be defined as:

$$TLF(r) = \frac{S_{TLC}(r)}{S_{NC}(r)} \times 100, \quad [1]$$

where ($S_{TLC}$) is the total leakage contamination signal from all other simultaneously acquired slices within the targeted dummy slice of an $MB\text{-}RF_{out}$ acquisition, $S_{NC}$ is the signal of the targeted slice in the absence of contamination (where NC indicates no contamination), and r represents spatial location. $S_{NC}$ can be acquired, for example, by using a multiband excitation/acquisition with $MB\text{-}RF_{in}$. In a further embodiment, $S_{NC}$ can be determined by using a conventional single-band excitation of the slice of interest using MR imaging parameters that correspond to those used in a MB acquisition (e.g. the $MB\text{-}RF_{out}$ acquisition).

The levels of both leakage contamination and imaging signals can be affected by subject bulk motion across time. To account for such motion effects on actual MB imaging contamination, a time series of MB imaging with MB RF pulse component manipulations can be acquired, and the temporal mean signals can used to evaluate TLF. To determine the amount of such signal contamination from all other slices on a particular target slice, the ratios of the signals from the dummy slices acquired with $MB\text{-}RF_{out}$, $S_{MB\text{-}RF_{out}}^{Dummy}(r,l)$, are taken with respect to the signals of the excited slices from the $MB\text{-}RF_{in}$, $S_{MB\text{-}RF_{in}}(r,l)$, where the previous dummy slices become the excited slices. Therefore, maps of TLF expressed as a percentage are given as:

$$TLF(r) = \frac{mean_{l=1}^{l=L}(S_{MB\text{-}RF_{out}}^{Dummy}(r,l))}{mean_{l=1}^{l=L}(S_{MB\text{-}RF_{in}}(r,l))} \times 100, \quad [2]$$

and a summary of TLF from a given region given as:

$$TLF_{r \in ROI}^{mean} = mean_{r=1}^{r=R}(TLF(r)), \quad [3]$$

where l and L are the index and total number of MB images, respectively. When evaluating the TLF, single-band (SB) images acquired with MR imaging parameters substantially matching those of the MB conditions can be used as a reference for fraction calculations, since SB images will not contain spatially-varying amplified thermal noises. In further embodiments, $MB\text{-}RF_{in}$ imaging sequences can be used for the fraction calculations. For example, it has been observed that in a typical imaging procedure, a difference between TLFs determined based on images acquired with $MB\text{-}RF_{in}$ and SB imaging methods were much less than 1%.

As an example, a MB-EPI imaging procedure was conducted with an MB factor of 6 on a healthy volunteer to assess the determination of leakage factors and total leakage factors. Imaging studies were performed on a 3T Siemens Trio whole-body scanner (MAGNETOM Trio, Siemens Healthcare, Erlangen, Germany). The body coil was used for RF transmission, and a Siemens 32-channel phased array head coil was used for signal reception. High-resolution 3D anatomic images were acquired by using an MPRAGE (magnetization-prepared rapid acquisition with gradient echo) sequence with 1.0 mm isotropic resolution after a multi-plane scout localizer. These high-resolution images were used as the reference to prescribe imaging slices for the following ASL studies.

Figure 4A:
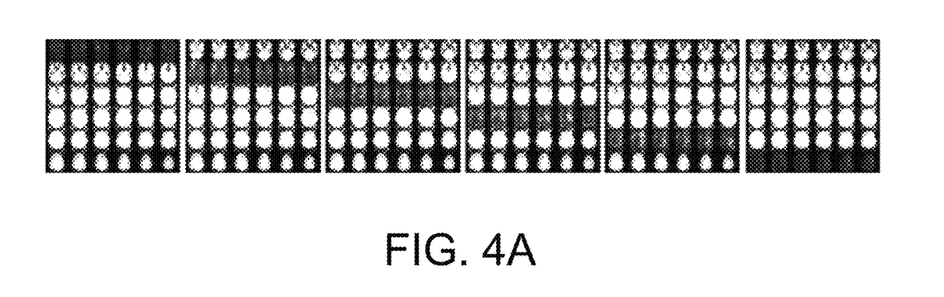
FIG. 4A is an exemplary series of MB magnetic resonance images showing multi-band leakage effects arising when one slice of the simultaneously-excited slices is nulled.

FIG. 4A shows a series of six LEADS imaging results for this exemplary MB-EPI imaging procedure. Each image in FIG. 4A was obtained using a multi-band RF excitation pulse with the slice excitation turned off for one particular slice (e.g., MB imaging with $MB\text{-}RF_{out}$). The light image artifacts visible in each "dark" row of FIG. 4A result from leakage from the other excited slices in each image set.

Figure 4B:
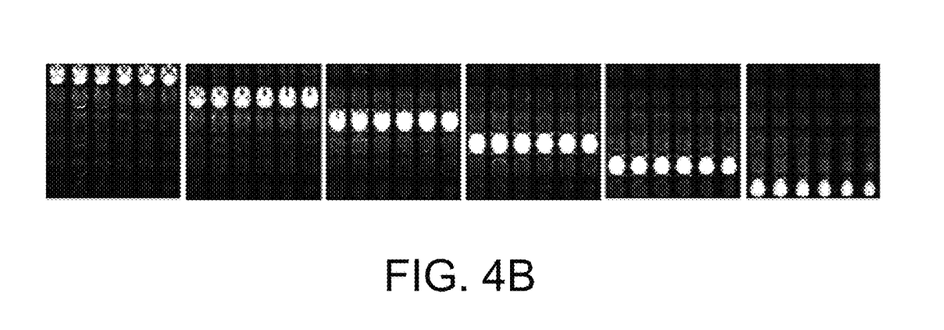
FIG. 4B is an exemplary series of MB magnetic resonance images corresponding to those shown in FIG. 4A, illustrated conventional MB leakage effects that occur when just one slice of the plurality of slices is excited to generate image data.

FIG. 4B shows a series of 6 conventional leakage factor (LF) imaging results for an MB-EPI imaging procedure with an MB factor of 6, using substantially the same imaging parameters used to obtain the LEADS images in FIG. 4A. Each image in FIG. 4B was obtained using a multi-band RF excitation pulse with the slice excitation turned on for just one particular slice (e.g., MB imaging with $MB\text{-}RF_{in}$). The light image artifacts visible in the "dark" rows in each image represent leakage from the single excited slice into the other unexcited "dummy" slices during the MB excitation and image acquisition sequences.

Figure 4C:
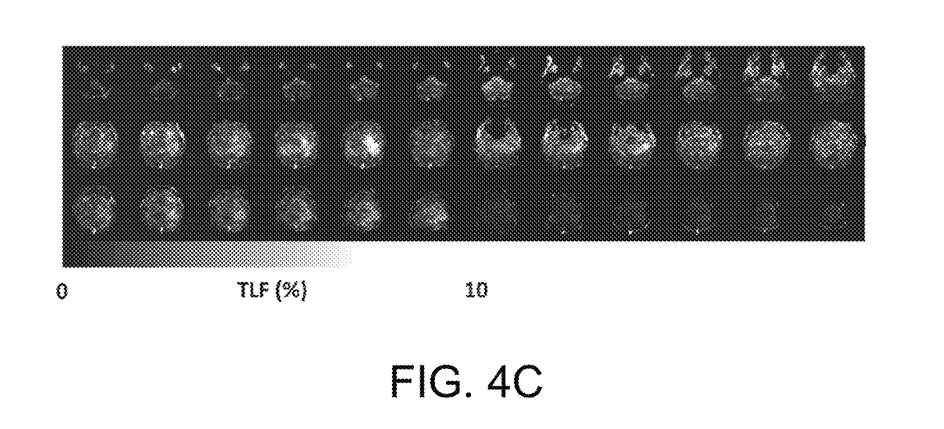
FIG. 4C is a series of total leakage factor (TLF) maps obtained from the images shown in FIG. 4A in accordance with embodiments of the present disclosure.

TLF maps based on the LEADS image data in FIG. 4A are shown in FIG. 4C. These TLF maps are calculated as the ratio between the total RF leakage signal measured in voxels of a dummy image slice, obtained using $MB\text{-}RF_{out}$ pulse sequences, and corresponding RF signals obtained in reference images using $MB\text{-}RF_{in}$ as pulse sequences in MB imaging acquisitions, e.g., as described herein by eq. [2]. The observed TLF varies spatially, both and within an imaging slice and across different slices, and some areas can have much higher levels of TLF than surrounding regions, as represented by the "hot spots" (lighter regions) in the exemplary TLF maps shown in FIG. 4C. These locally elevated leakage contaminations are a significant factor in MB imaging reconstruction failure. The MB leakage contamination is also a source of errors in quantitative imaging, and represents an underlying source of degradation in MB images.

Figure 5:
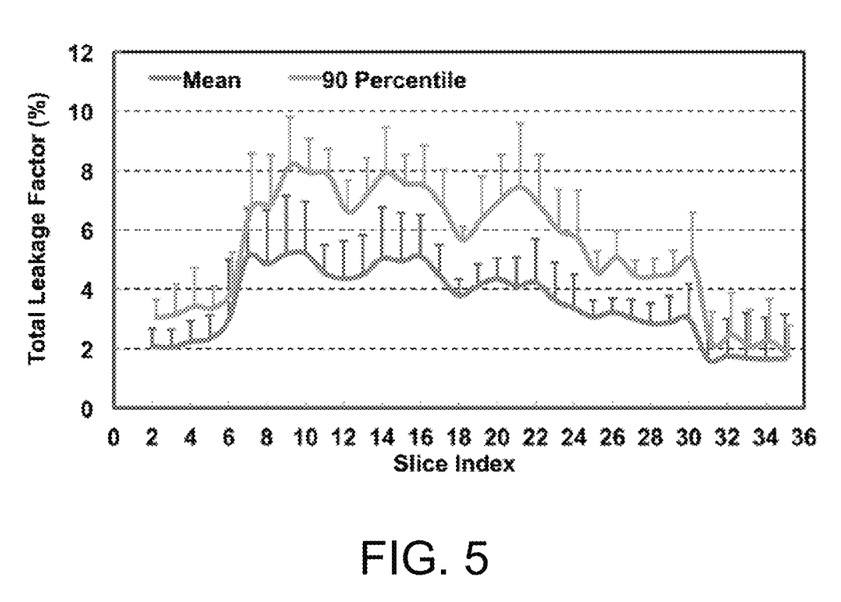
FIG. 5 is a graph of observed TLF values (mean and $90^{th}$ percentile) from 5 imaged subjects as a function of slice index.

Quantitative estimations of slice-wise TLF (total leakage factor) obtained from MB-EPI imaging procedures (MB factor of 6) performed on five healthy subjects, using the exemplary method and system described herein, are shown in FIG. 5. The lower curve in FIG. 5 represents the mean TLF value obtained as a function of slice index. The upper curve represents the $90^{th}$ percentile values of TLF, and the error bars on both curves represent standard errors. The exemplary data shown in FIG. 5 provide a quantitative measure of the variation in local TLF across slices. For example, the TLF is larger in the middle or inferior middle brain regions than in other regions of a brain that is imaged using multi-band techniques. The error bars shown in FIG. 5 also indicate that TLF is subject dependent, and may vary among individual subjects that are imaged using MB techniques having the same imaging parameters.

The TLF factors and associated MB leakage image data (obtained, e.g., using the LEADS technique described herein that is based on adaptive MB imaging as also described herein) can be used to evaluate image reconstruction accuracy in general MB imaging, as described herein. By comparing TLF factors and associated MB leakage, an optimized image reconstruction approach can be more easily identified. For example, when performing a conventional SENSE image reconstruction, the TLF information can be used to guide the generation of more accurate coil sensitivity profiles. For GRAPPA or slice-GRAPPA image reconstructions, the TLF information can be used to develop an optimized kernel training model. The TLF data can also be used to identify a superior algorithm for compressive-sensing.

In these various image reconstruction examples, further embodiments of the present disclosure can be provided in which TLF information can be used to improve MB image quality by accounting for the effects of MB leakage and reducing its effect on reconstructed images. For example, a leakage constrained slice-GRAPPA technique can be used to provide a kernel fitting function that minimizes TLF factors and associated MB leakage effects. Such improved kernel fitting function can then be used to generate improved MB images. An example of a conventional kernel calculation technique that can be used in this and similar embodiments is described, e.g., in S. F. Cauley et al., *Interslice leakage artifact reduction technique for simultaneous multislice acquisitions*, Magn Reson Med, 72:93-102, 2013. The usage of TLF and associated MB leakage image data can be used for reconstruction optimization of images acquired with Cartesian sampling. In further embodiments, improved image reconstruction techniques using TLF and MB leakage information can be applied to MB image data acquired with non-Cartesian sampling such as, e.g., radial or spiral sampling.

In further embodiments, an image reconstruction kernel can be fitted based on both image artifacts and MB leakage data. For example, exemplary MB image data can be obtained that includes one "dummy" slice in each pulse sequence to assess leakage from the other excited slices. A total leakage factor (TLF) can be determined as described herein, and the leakage data can be used to determine a reconstruction kernel that reduces the effects of image artifacts and the levels of signal noise.

In still further embodiments, MB image reconstruction can be performed using a combination of two or more of the adaptive image data acquisition and/or image reconstruction techniques described herein. The various adaptive approaches for MB reconstruction described herein above can be combined and applied together within a single MB acquisition (e.g. a single pulse sequence that excites a plurality of slices simultaneously) and/or applied to a series of MB multislice data acquisitions. Such combinations are generally combinable and would present no incompatibility. The selection of one or more different adaptive MB reconstruction and/or adaptive acquisition techniques to combine can be based on the particular volume being imaged and details of the magnetic resonance system ($B_0$ magnetic field strength, RF coil number and types, etc.). For example, in a renal MB imaging procedure with sagittal slices covering both kidneys, adaptive MB RF pulses can be used to avoid the unnecessary acquisition of slices between the two kidneys, and different FOV shift factors may be provided across excited slices to locate the regions of largest leakage contamination (e.g., 'hot spots') away from the kidneys.

In still further embodiments, adaptive MB imaging settings and/or reconstruction configurations as described herein can be used with an imaging time series acquisition, in which different sets of MB imaging parameters and/or different MB reconstruction configurations can be applied across different time points. In one embodiment, different phase encoding FOV shift factors can be applied across time points during a series of imaging acquisitions. This exemplary procedure can vary the spatial location of any concentrations of total leakage contamination (e.g., "hot spots") to reduce the adverse effects of total leakage contamination when localized in one location.

Figure 6:
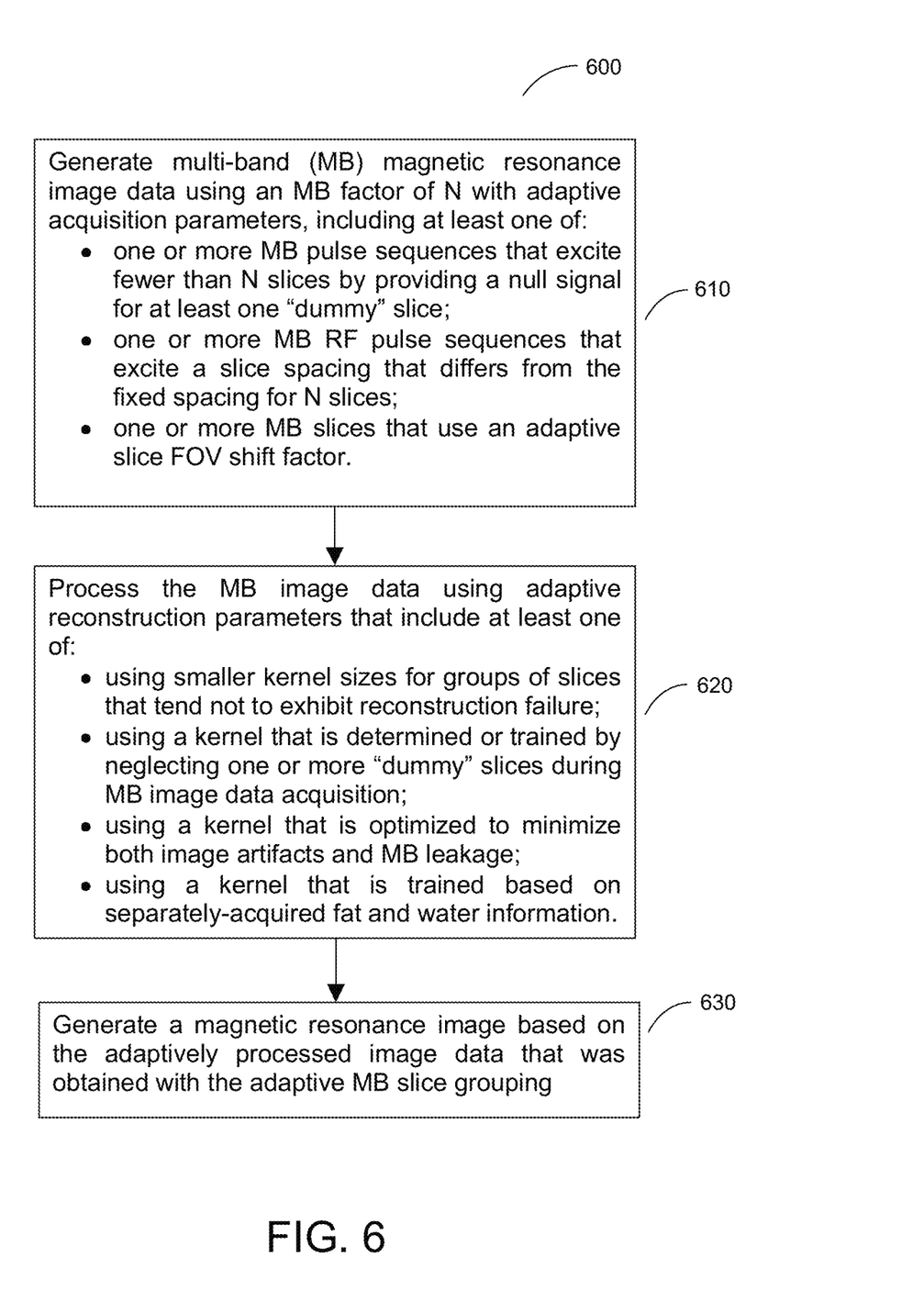
FIG. 6 is a flowchart of an exemplary adaptive multi-band magnetic resonance imaging method in accordance with embodiments of the present disclosure.

An exemplary method for adaptive multi-band (MB) magnetic resonance imaging is shown in the flowchart 600 of FIG. 6. In a first step 610 of the exemplary method, multi-band (MB) magnetic resonance image data is generated using an MB factor of N with adaptive acquisition parameters. In one embodiment, the adaptive acquisition parameters include at least one MB pulse sequence of the series of pulse sequences that is configured to excite fewer than N slices, e.g., by providing a null signal for the portion of the excitation pulse sequence corresponding to one or more "dummy" slices. Accordingly, as described herein, at least two pulse sequences during the MB imaging procedure (e.g., a series of such MB pulse sequences) will generate image data based on a different number of simultaneously-excited slices. In another embodiment, the adaptive acquisition parameters include one or more MB RF pulse sequences that excite a slice spacing that differs from the fixed spacing used for N slices. In a further embodiment, the adaptive acquisition parameters include providing an adaptive (e.g., non-constant) slice FOV shift factor when exciting one or more MB slices, such that at least two of the slices are excited using different FOV shift factors during the MB procedure.

The next step 520 includes processing the adaptive MB image data using adaptive reconstruction parameters. One or more of the adaptive techniques described herein can be used to process the MB image data. For example, adaptive kernel sizes can be used for image reconstruction, e.g., smaller kernel sizes can be utilized for groups of slices that tend not to exhibit reconstruction failure. Also, a kernel can be determined or trained based on the presence of one or more "dummy" slices during MB image data acquisition, such that the kernel can be based on the actual number of slices excited in a particular MB pulse sequence, which may be less than the overall MB factor N. The reconstruction kernel can also be trained based on separately-acquired fat and water information, which can improve image quality by accounting for the effects of incomplete fat signal suppression and reducing the degree of lipid ghosting that can occur during EPI imaging procedures.

In further embodiments of the disclosure, the system 100 shown in FIG. 1 and/or the method 600 illustrated in FIG. 6 can include one or more adaptive acquisition parameters, or one or more adaptive reconstruction parameters, but not both.

The method 600 can be performed using the exemplary system 100 shown in FIG. 1, where certain details of the pulse sequences and associated field gradients used for image data acquisition, as well as details regarding the adaptive image processing and kernel fitting/training, are described herein and/or known in the art, e.g. in accordance with the references cited herein.

The foregoing merely illustrates the principles of the present disclosure. Various modifications and alterations to the described embodiments will be apparent to those skilled in the art in view of the teachings herein. It will thus be appreciated that those skilled in the art will be able to devise numerous techniques which, although not explicitly described herein, embody the principles of the present disclosure and are thus within the spirit and scope of the present disclosure. All patents and publications cited herein are incorporated herein by reference in their entireties.

What is claimed is:

1. An MR imaging system for generating a multi-band (MB) image of a region of interest, comprising:
a radio frequency (RF) signal generator and a magnetic field gradient generator which are together configured to provide a series of RF pulse and magnetic field gradient sequences for acquisition of MB image data, and
an image processing unit configured to generate the MB image of the region of interest based on the MB image data,
wherein the series of RF pulse and magnetic field gradient sequences comprises at least one adaptive acquisition parameter, wherein:
the series of RF pulse and magnetic field gradient sequences comprises at least one RF pulse and magnetic field gradient sequence configured to simultaneously excite a plurality of slices using a particular slice FOV shift factor; and
the adaptive acquisition parameter comprises a further slice FOV shift factor that is different from the particular slice FOV shift factor and is used to simultaneously excite at least one further slice.

2. The MR imaging system of claim 1, wherein:
the series of RF pulse and magnetic field gradient sequences comprises at least one RF pulse and magnetic field gradient sequence configured to simultaneously excite N slices, wherein each slice is located within one of a plurality of N slice groups; and
the adaptive acquisition parameter comprises at least one further RF pulse and magnetic field gradient sequence configured to simultaneously excite fewer than N slices.

3. The MR imaging system of claim 1, wherein:
the series of RF pulse and magnetic field gradient sequences comprises at least one RF pulse and magnetic field gradient sequence configured to simultaneously excite N slices having a particular spacing between the N slices; and
the adaptive acquisition parameter comprises at least one further RF pulse and magnetic field gradient sequence configured to simultaneously excite a plurality of slices having a further spacing between slices that is different from the particular spacing.

4. The MR imaging system of claim 1, wherein:
the series of RF pulse and magnetic field gradient comprises at least one RF pulse and magnetic field gradient sequence configured to simultaneously excite N slices; and
the adaptive acquisition parameter comprises a non-uniform spacing between nearest ones of the N excited slices provided by the at least one RF pulse and magnetic field gradient sequence.

5. The MR imaging system of claim 1, wherein:
the series of RF pulse and magnetic field gradient sequences comprises at least one RF pulse and magnetic field gradient sequence configured to simultaneously excite N slices having a particular spacing between the N slices; and
the adaptive acquisition parameter comprises at least one further RF pulse and magnetic field gradient sequence configured to simultaneously excite a plurality of slices having a further spacing between slices that is different from the particular spacing.

6. The MR imaging system of claim 1, wherein:
the MB image data is generated as a time series acquisition using a particular set of MB imaging parameters, and
the adaptive acquisition parameter comprises a further set of MB imaging parameters that is different from the particular set of MB imaging parameters and is used to acquire a portion of the MB image data for at least one time point of the time series.

7. The system of claim 6, wherein the particular set of MB imaging parameters comprises a particular FOV shift factor, and the further set of MB imaging parameters comprises a different FOV shift factor.

8. The system of claim 1, wherein the imaging processing unit is configured to generate the MB image based on an adaptive reconstruction technique.

9. The system of claim 8, wherein the adaptive reconstruction technique comprises using different kernel sizes for reconstruction of at least two different groups of slice image data.

10. The system of claim 8, wherein:
the series of RF pulse and magnetic field gradient sequences comprises at least one RF pulse and magnetic field gradient sequence configured to simultaneously excite N slices, wherein each slice is located within one of a plurality of N slice groups;
the adaptive acquisition parameter comprises at least one further RF pulse and magnetic field gradient sequence configured to simultaneously excite fewer than N slices; and
the adaptive reconstruction technique comprises using a kernel that is determined based on the adaptive acquisition parameter.

11. The system of claim 8, wherein the adaptive reconstruction technique comprises using a kernel that is trained based on separately-acquired fat and water information.

12. The system of claim 8, wherein the adaptive reconstruction technique comprises using a kernel fitting function that minimizes total leakage factor and associated MB leakage effects for a leakage constrained slice-GRAPPA technique.

13. A method for generating a multi-band (MB) magnetic resonance image of a region of interest, comprising the steps of:
(a) providing a series of radio frequency (RF) pulse and magnetic field gradient sequences for acquisition of MB image data using a signal generator and a magnetic field gradient generator, wherein the series of RF pulse and magnetic field gradient sequences comprises an adaptive acquisition parameter;
(b) detecting the MB image data generated by the excited slices using a coil arrangement; and
(c) generating the MB magnetic resonance image based on the MB image data, wherein:
the series of RF pulse and magnetic field gradient sequences comprises at least one RF pulse and magnetic field gradient sequence configured to simultaneously excite a plurality of slices using a particular slice FOV shift factor; and
the adaptive acquisition parameter comprises a further slice FOV shift factor that is different from the particular slice FOV shift factor and is used to simultaneously excite at least one further slice.

14. The MR imaging method of claim 13, wherein:
the series of RF pulse and magnetic field gradient sequences comprises at least one RF pulse and magnetic field gradient sequence configured to simultaneously excite N slices, wherein each slice is located within one of a plurality of N slice groups; and
the adaptive acquisition parameter comprises at least one further RF pulse and magnetic field gradient sequence configured to simultaneously excite fewer than N slices.

15. The MR imaging method of claim 13, wherein:
the series of RF pulse and magnetic field gradient sequences comprises at least one RF pulse and magnetic field gradient sequence configured to simultaneously excite N slices having a particular spacing between the N slices; and
the adaptive acquisition parameter comprises at least one further RF pulse and magnetic field gradient sequence configured to simultaneously excite a plurality of slices having a further spacing between slices that is different from the particular spacing.

16. The MR imaging method of claim 13, wherein:
the series of RF pulse and magnetic field gradient comprises at least one RF pulse and magnetic field gradient sequence configured to simultaneously excite N slices; and
the adaptive acquisition parameter comprises a non-uniform spacing between nearest ones of the N excited slices provided by the at least one RF pulse and magnetic field gradient sequence.

17. The MR imaging method of claim 13, wherein:
the series of RF pulse and magnetic field gradient sequences comprises at least one RF pulse and magnetic field gradient sequence configured to simultaneously excite N slices having a particular spacing between the N slices; and
the adaptive acquisition parameter comprises at least one further RF pulse and magnetic field gradient sequence configured to simultaneously excite a plurality of slices having a further spacing between slices that is different from the particular spacing.

18. The MR imaging method of claim 13, wherein generating the MB magnetic resonance image comprises generating the MB magnetic resonance image based on an adaptive reconstruction technique.

19. The MR imaging method of claim 18, wherein the adaptive reconstruction technique comprises at least one of:
using different kernel sizes for reconstruction of at least two different groups of slice image data;
using a kernel that is determined based on the adaptive acquisition parameter;
using a kernel that is trained based on separately-acquired fat and water information; and
using a kernel fitting function that minimizes total leakage factor and associated MB leakage effects for a leakage constrained slice-GRAPPA technique.

* * * * *